United States Patent
Lin et al.

[11] Patent Number: 6,121,088
[45] Date of Patent: Sep. 19, 2000

[54] METHOD OF MANUFACTURE OF UNDOPED POLYSILICON AS THE FLOATING-GATE OF A SPLIT-GATE FLASH CELL

[75] Inventors: Yai-Fen Lin, Taichung; Chia-Ta Hsieh, Tainan; Hung-Cheng Sung, Hsinchu; Juang-ke Yeh, Hsin-chu; Di-Son Kuo, Hsinchu, all of Taiwan

[73] Assignee: Taiwan Semiconductor Manufacturing Company, Hsin-Chu, Taiwan

[21] Appl. No.: 09/156,054

[22] Filed: Sep. 17, 1998

[51] Int. Cl.[7] .................... H01L 21/336; H01L 21/4763
[52] U.S. Cl. ................. 438/264; 438/257; 438/594
[58] Field of Search .................... 438/264, 197, 438/211, 257, 279, 299, 448, 593, 594, 942, 943

[56] References Cited

U.S. PATENT DOCUMENTS

| | | |
|---|---|---|
| 4,274,012 | 6/1981 | Simko .................... 307/238.3 |
| 4,462,089 | 7/1984 | Milda et al. .............. 365/185 |
| 4,599,706 | 7/1986 | Guterman ................ 365/185 |
| 4,698,787 | 10/1987 | Mukherjee et al. ........ 365/185 |
| 4,861,730 | 8/1989 | Hsia et al. ................ 437/43 |
| 4,964,143 | 10/1990 | Haskell ................... 357/23.5 |
| 5,045,488 | 9/1991 | Yeh ......................... 437/43 |
| 5,067,108 | 11/1991 | Jeng ........................ 365/185 |
| 5,371,028 | 12/1994 | Koh .......................... 437/43 |
| 5,532,178 | 7/1996 | Liaw et al. ................. 437/57 |
| 5,651,859 | 7/1997 | Chan et al. ................ 156/657.1 |
| 5,750,427 | 5/1998 | Kaya et al. ............... 438/264 |
| 5,814,551 | 9/1998 | Park et al. ................ 438/448 |

*Primary Examiner*—Matthew Smith
*Assistant Examiner*—Lex H. Malsawma
*Attorney, Agent, or Firm*—George O. Saile; Stephen B. Ackerman; Graham S. Jones, II

[57] ABSTRACT

Form a split gate EEPROM memory device on a doped silicon semiconductor substrate starting with an initial oxide layer and form an undoped first polysilicon layer thereon. Then form a polysilicon oxide hard mask over the undoped first polysilicon layer for use in patterning the initial oxide layer and the undoped first polysilicon layer which are then etched to form a floating gate electrode stack from the undoped first polysilicon layer and the initial oxide layer on the substrate. Then form a tunnel oxide layer and a doped polysilicon and pattern them into control gate electrode stack, with the control gate electrode stack being located in a split-gate configuration with respect to the floating gate electrode stack.

10 Claims, 4 Drawing Sheets

METHOD OF MANUFACTURE OF UNDOPED POLYSILICON AS THE FLOATING-GATE OF A SPLIT-GATE FLASH CELL

BACKGROUND OF THE INVENTION

1. Field of the Invention

This invention relates to semiconductor memory devices and more particularly to split gate, flash memory devices.

2. Description of Related Art

U.S. Pat. No. 5,532,178 of Liaw for "Gate Process for NMOS ESD Protection Circuits" shows an undoped silicide gate, with flash memory, with no floating gates and no control gates, for a ESD device where an N implant is unwanted, e.g. in PMOS device areas. At col. 5 lines 49 et seq. Liaw states the following "The undoped polysilicon gates of the NMOS ESD circuit give the NMOS devices a higher breakdown voltage Vg that ensures that the ESD circuit will protect the product devices. The undoped polysilicon gate electrode. . .also allows the use of thinner gate oxides thereby increasing the speed of the product devices."

U.S. Pat. No. 4,698,787 of Mukherjee et al. for "Single transistor electrically programmable memory device and method"

U.S. Pat. No. 4,964,143 of Haskell for an EPROM element employing self-aligning process; U.S. Pat. No. 5,067,108 of Jenq for Single transistor non-volatile electrically alterable semiconductor memory device with a re-crystallized floating gate; U.S. Pat. No. 4,599,706 of Guterman; U.S. Pat. No. 4,462,089 of Miida et al.; and U.S. Pat. No. 4,274,012 of Simko all show Electrically Erasable Programmable Read Only Memory (EEPROM) devices.

SUMMARY OF THE INVENTION

N+ doped polysilicon gate electrodes are used for almost all the floating gate of the nonvolatile memory cells. Although the split-gate Flash is well known for its higher programming speed, as the result of an effort directed to improving the programming speed we have found that the speed of programming is even faster by using the undoped polysilicon 1 as the material in the floating gate electrode.

An advantage of this new structure is that the threshold under the floating gate electrode is increased, which increases the immunity from punchthrough.

Another advantage of this new structure is that the programming speed is increased.

In accordance with this invention, a method of forming a split gate EEPROM memory device on a doped silicon semiconductor substrate comprises the steps which follow in accordance with the description relating to FIGS. 2A–2F in copending, commonly assigned U.S. patent application Ser. No. 08/988,764 (TSMC97-173) filed Dec. 11, 1997 by the same inventors Hung-Cheng Sung, Di-Son Kuo, Yai-Fen Lin and Chia-Ta Hsieh for "Process for Preventing Misalignment in Split-Gate Flash Memory Cell" which is incorporated herein by reference.

Form an oxide layer upon the surface of the silicon substrate. Then, form an undoped first polysilicon layer upon the top surface of the oxide layer. Form a silicon nitride layer upon the top surface of the undoped first polysilicon layer. Next, form a photoresist mask for patterning the silicon nitride layer and then etch the silicon nitride layer through the openings in the photoresist mask, stopping on the undoped first polysilicon layer. Remove the photoresist. Then perform a polysilicon oxidation to form a polysilicon oxide hard mask for use in patterning the undoped first polysilicon layer and the oxide layer therebelow. Then remove the remainder of the silicon nitride layer. Next, etch down through the undoped first polysilicon layer and the gate oxide layer to form a floating gate electrode. Form a blanket tunnel oxide layer over the floating gate electrode stack and over the substrate aside from the floating gate electrode stack. Then, form a doped, second polysilicon layer over the tunnel oxide layer. Pattern the the second polysilicon layer and the blanket tunnel oxide layer using a mask and etching to form a split control gate electrode above the substrate and crossing over only one edge of the floating gate electrode stack. Form in the configuration of a split gate EEPROM memory device a source region associated with the floating gate stack and a drain region associated with the control gate stack.

Preferably, the oxide layer is composed of silicon dioxide ($SiO_2$) and has a thickness from about 50 Å to about 100 Å. The undoped first polysilicon layer has a thickness from about 500 Å to about 1500 Å. The blanket tunnel oxide layer has a thickness from about 150 Å to about 300 Å. The floating gate electrode and the control gate electrode are in proximity along the sidewalls thereof.

In accordance with another aspect of this invention, a split gate EEPROM memory device is formed on a doped silicon semiconductor substrate. A floating gate electrode stack comprises undoped polysilicon to serve as a floating gate electrode and a dielectric layer formed on the substrate, and a control gate electrode stack with doped polysilicon and a second dielectric layer. The control gate electrode stack is located in a split-gate configuration with respect to the floating gate electrode stack.

In accordance with still another aspect of this invention, a split gate EEPROM memory device on a doped silicon semiconductor substrate comprises an oxide layer upon the surface of the substrate. There is an undoped first polysilicon layer upon the substrate. The oxide layer and the undoped first polysilicon layer are formed into a floating gate electrode stack with a concave upper surface formed on the floating gate electrode by polysilicon oxidation. There is a blanket tunnel oxide layer over the floating gate electrode stack and over the substrate aside from the floating gate electrode stack and a doped, second polysilicon layer over the tunnel oxide layer. The blanket tunnel oxide layer and the second polysilicon layer are patterned into a split control gate electrode above the substrate and crossing over only one edge of the floating gate electrode stack. The device is in the configuration of a split gate EEPROM memory device a source region associated with the floating gate stack and a drain region associated with the control gate stack.

Preferably, the oxide layer is composed of silicon dioxide and has a thickness from about 50 Å to about 100 Å. The undoped first polysilicon layer has a thickness from about 500 Å to about 1500 Å. The blanket tunnel oxide layer has a thickness from about 150 Å to about 300 Å. The floating gate electrode and the control gate electrode are in proximity along the sidewalls thereof.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
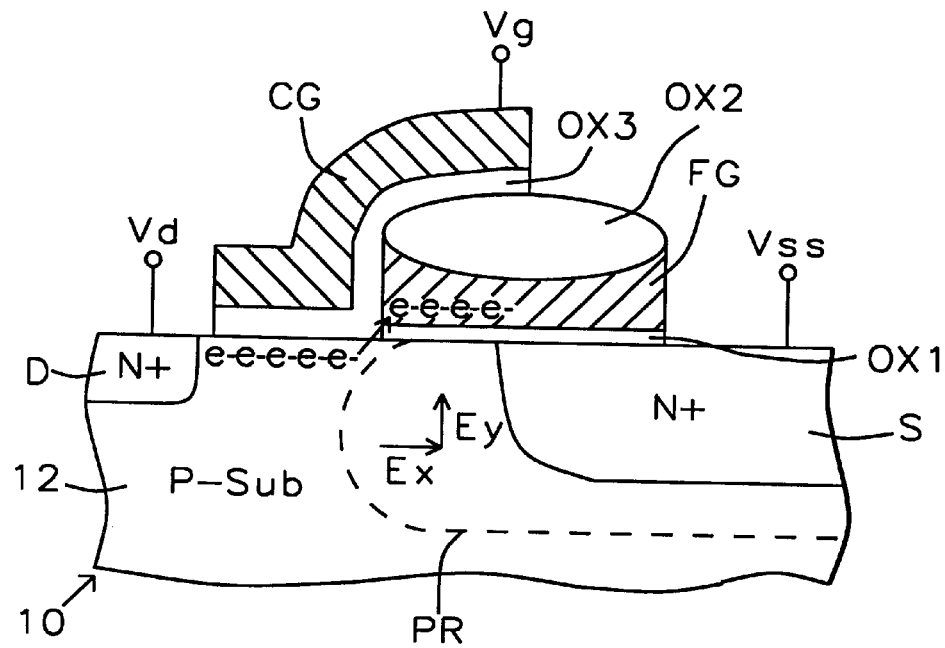
FIG. 1 shows a flash memory device in accordance with this invention, wherein a P-substrate contains a N+ doped source region on the right and a N+ doped drain region on the left, which is self-aligned with a control gate electrode, which is located above the device between the source and drain regions.

FIG. 1 shows a flash memory device 10 in accordance with this invention, wherein a P-substrate contains a N+ doped source region S on the right and a N+ doped drain region D on the left, which is self-aligned with a control gate electrode CG. The control gate electrode CG is located above the device 10 between the source region S and the drain region D. A silicon oxide layer OX1, e.g. silicon dioxide ($SiO_2$), and a floating gate electrode FG are formed into a floating gate electrode stack extending across the left end of the source region S.

The floating gate electrode stack comprises a polysilicon 1 silicon oxide layer OX2 and a concave floating gate electrode FG which are formed on the surface of the substrate 12. The concave upper surface of floating gate electrode FG is formed by polysilicon oxidation producing convex polysilicon oxide hard mask OX2 on the top surface of floating gate electrode FG. Silicon oxide layer OX1 has a thickness from about 50 Å to about 100 Å. The floating gate electrode FG, which is unusual in that it is composed of undoped polysilicon 1, has a thickness from about 500 Å to about 1,500 Å.

Covering the left end of the floating gate electrode FG including the left sidewall and the to surface thereof is a tunnel oxide layer OX3 with a thickness from about 150 Å to about 300 Å beneath the control gate CG.

The method of formation of the device 10 involves formation of a P– doped silicon semiconductor substrate 12, formation of a silicon oxide layer OX1 on the surface of substrate 12. The method is described in detail in copending, commonly assigned U.S. patent application Ser. No. 08/988, 764 of Sung et al. as described above. Next, an undoped polysilicon 1 layer FG with a thickness from about 500 Å to about 1,500 Å is formed over silicon oxide layer OX1. Then silicon nitride layer (not shown) is formed upon the top surface of the undoped and unpatterned first polysilicon layer FG. Next, a photoresist mask is formed to pattern the silicon nitride layer; and then etch the silicon nitride layer through the openings in the photoresist mask, stopping on the undoped first polysilicon layer FG. Remove the photoresist. Then perform a polysilicon oxidation to form polysilicon oxide OX2, forming a concave profile on the upper surface of floating gate electrode FG producing the silicon oxide hard mask OX2, for use as a hard mask for patterning the layer FG and the "initial"silicon oxide layer. Then etch down through the undoped first polysilicon layer FG and the gate oxide layer OX1 to form a floating gate electrode. Then the undoped polysilicon 1 layer FG and the silicon oxide layer OX1 are patterned into the floating gate electrode stack of the undoped polysilicon 1, floating gate electrode FG and silicon oxide layer OX1.

The upper surface of the floating gate electrode FG is concave so that the outer edges are higher than the center.

Then a tunnel oxide layer OX3 with a thickness from about 150 Å to about 300 Å is formed over the surface of the device 12 including the floating gate FG and the sidewalls of the floating gate stack. Above the tunnel oxide layer OX3 is formed a doped, polysilicon 2 layer with a thickness from about 1,000 Å to about 3,000 Å.

Then the polysilicon 2 layer and the tunnel oxide layer OX3 are patterned into the control gate electrode stack of the polysilicon 2, control gate electrode CG and tunnel oxide layer OX3 providing a split gate electrode structure because the control gate is located across the left side of the control gate electrode FG.

Next, the drain/source regions D/S are formed in a self-aligned ion implantation process with a dose of phosphorus dopant from about 1 E 15 ions/cm$^2$ to about 1 E 16 ions/cm$^2$ at an energy from about 10 keV to about 100 keV.

A substantial gap exists between the drain region D and the floating gate electrode FG as in the usual split gate flash memory device, where the control gate electrode CG serves as a gate electrode above the tunnel oxide layer OX3 between the drain region D and source region S.

In addition, the source region S is created extending beneath the floating gate electrode in an ion implantation and thermal treatment the lateral diffusion will reach under the floating gate electrode FG.

The undoped floating gate electrode FG and the control gate electrode CG are in proximity along the vertical sidewalls thereof, midway between the drain region D and the source S.

Figure 2:
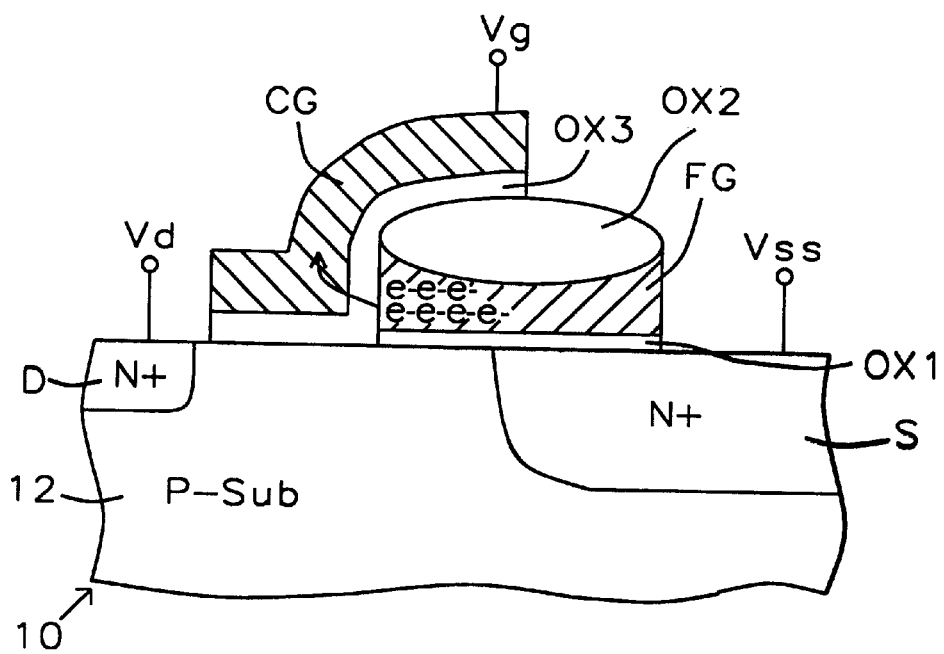
FIG. 2 illustrates the erasing scheme for the device of FIG. 1 with charge below the portion of the control gate which stretches between the drain region and the floating gate electrode with an arrow indicating electrons moving from the floating gate to the control gate.

In FIGS. 1 and 2, the finished device 10 is shown with the drain region D connected to voltage Vd, the source region S connected to voltage Vss and the gate electrode CG connected to voltage Vg.

In FIG. 1, the programming scheme for the device 10 is illustrated with charge below the portion of the control gate which stretches between the drain region D and the floating gate electrode FG reaching with an arrow indicating electrons moving up into the floating gate with effect of the vertical Ey field attracting the electrons. During programming the parameters are as follows:

Source region (S) voltage Vss=9.5V

Control gate (CG) voltage Vg=2.0V

Drain region (D) voltage Vd=0.6V

The line PR indicates the depletion region while Vss forces on source size.

In FIG. 2, the erasing scheme for the device 10 is illustrated with charge below the portion of the control gate which stretches between the drain region D and the floating gate electrode FG with an arrow indicating electrons moving from the floating gate FG to the control gate CG. During erasing the parameters are as follows:

Source region (S) voltage Vss=0 V

Control gate (CG) voltage Vg=11 V

Drain region (D) voltage Vd=0 V

Figure 3:
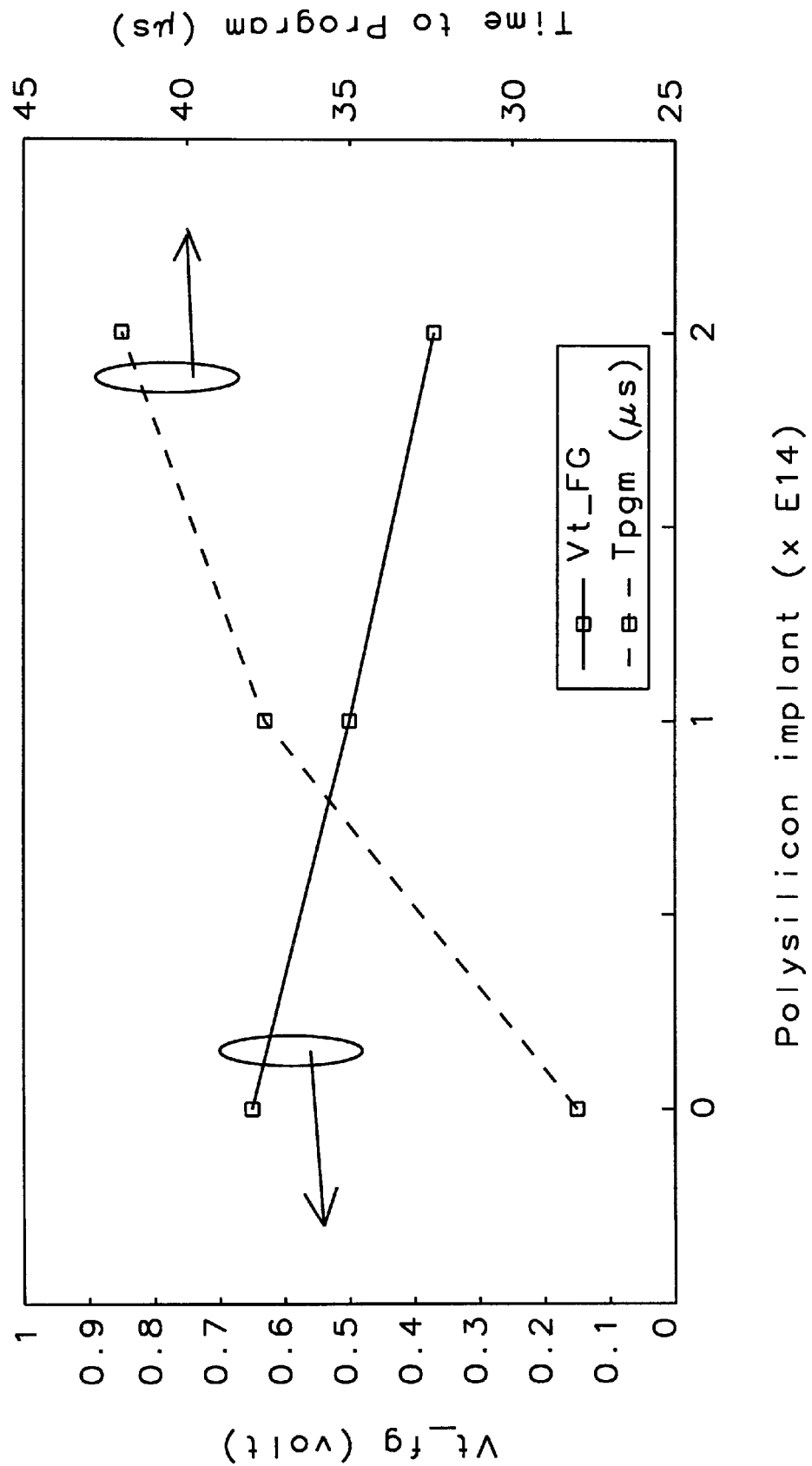
FIG. 3 is a graph of program speed for cells with a polysilicon 1 floating gate with different implant concentrations.

FIG. 3 is a graph of program speed for cells with a polysilicon 1 floating gate FG with different implant concentrations 0 E 14 atoms/cm$^3$, 1 E 14 atoms/cm$^3$, and 2 E 14 atoms/cm$^3$. On the left the voltage Vt_fg range is from 0 to 1 and the solid curve shows the higher voltage Vt_fg of about 0.7 for 0 E 14 atoms/cm$^3$, 0.55 for 1 E 14 atoms/cm$^3$ and 0.40 for 2 E 14 atoms/cm$^3$. On the right the range of times to program varies from 25 to 45 microseconds. The time to program Tpgm dotted curve shows the lower time about 27.5 microseconds for 0 E 14 atoms/cm$^3$, 37.5 microseconds for 1 E 14 atoms/cm$^3$ and 42 microseconds for 2 E 14 atoms/cm$^3$.

The Idw of the cells is measured by applying the Vss=9.5 v, Vg=2 v, Idp=−5 $\mu$A, for 10 $\mu$S.

The value of $V_T$ increases due to
1. The lower work function of the difference from the floating gate to the substrate, and
2. Surface B concentration is higher without the conventional floating gate ion implantation step.

It is conjectured that the latter may be the primary reason for the higher programming speed. With higher surface concentration, depletion width during programming is narrower, there is a higher vertical field Ey as seen in FIG. 1 so there is a higher voltage drop across the oxide, rather than the depletion region. Therefore, there is a higher injection efficiency.

Figure 4:
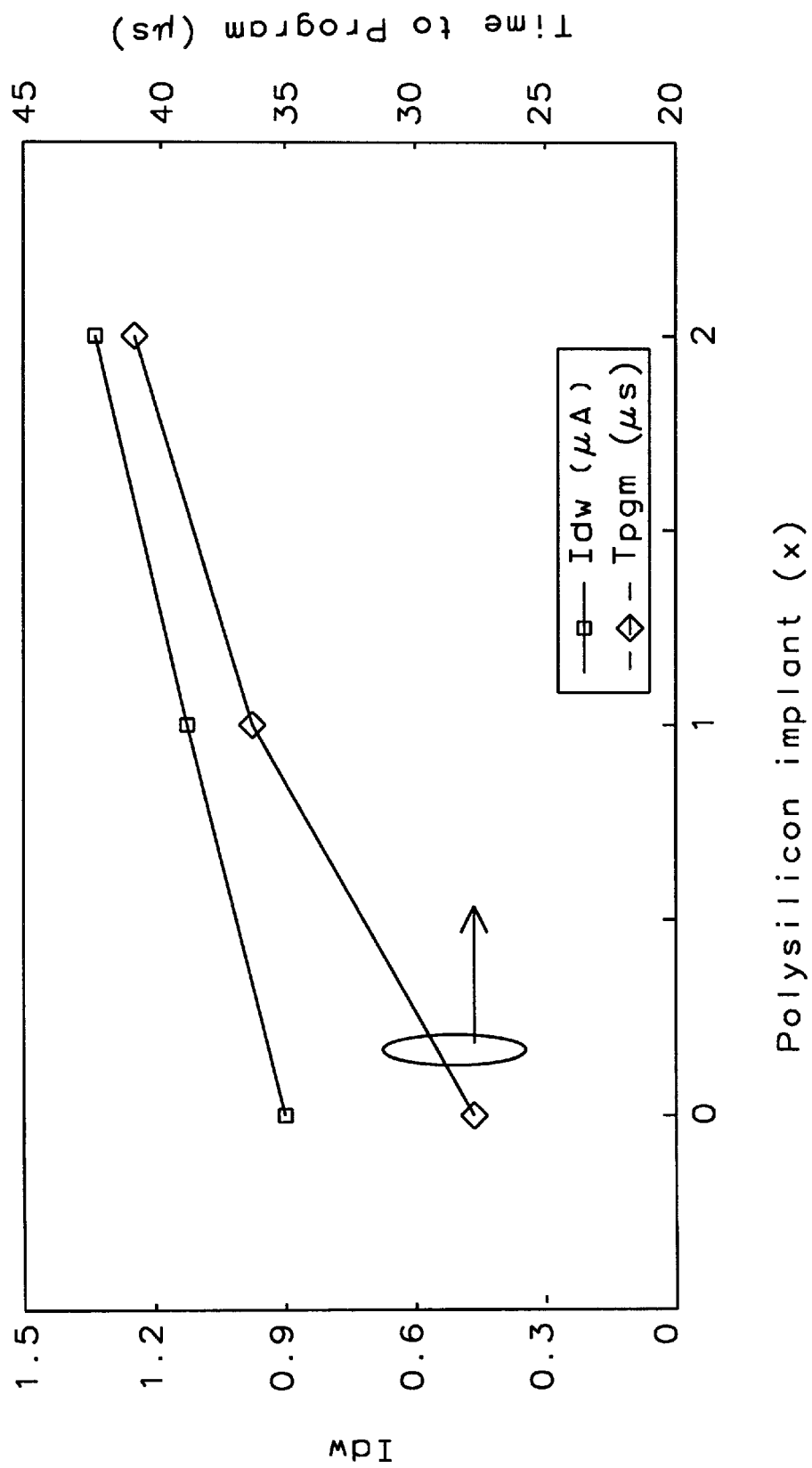
FIG. 4 is another graph of program speed for cells with a polysilicon 1 floating gate with different implant concentrations.

FIG. 4 is a graph of program speed for cells with a polysilicon 1 floating gate FG with different implant concentrations 0 E 14 atoms/cm$^3$, 1 E 14 atoms/cm$^3$, and 2 E 14 atoms/cm$^3$. On the left the current Idw range is from 0 to 1.5 and the Idw (microamperes) curve shows the lower current of about 0.95 for 0 E 14 atoms/cm$^3$, 1.2 for 1 E 14 atoms/cm$^3$ and 1.35 for 2 E 14 atoms/cm$^3$.

On the right the range of times to program is slightly wider than in FIG. 3, varying from 20 to 45 microseconds. The time to program curve Tpgm shows the lower time about 27.5 microseconds for 0 E 14 atoms/cm$^3$, 37.5 microseconds for 1 E 14 atoms/cm$^3$ and 42 microseconds for 2 E 14 atoms/cm$^3$.

Again, the Idw of the cells is measured by applying the Vss=9.5 v, Vg=2 v, Idp=−5 $\mu$A, for 10 $\mu$S.

The current Idw is the current after programming with a lower Idw due to more charge on the floating gate, given the same programming time.

Figure 5:
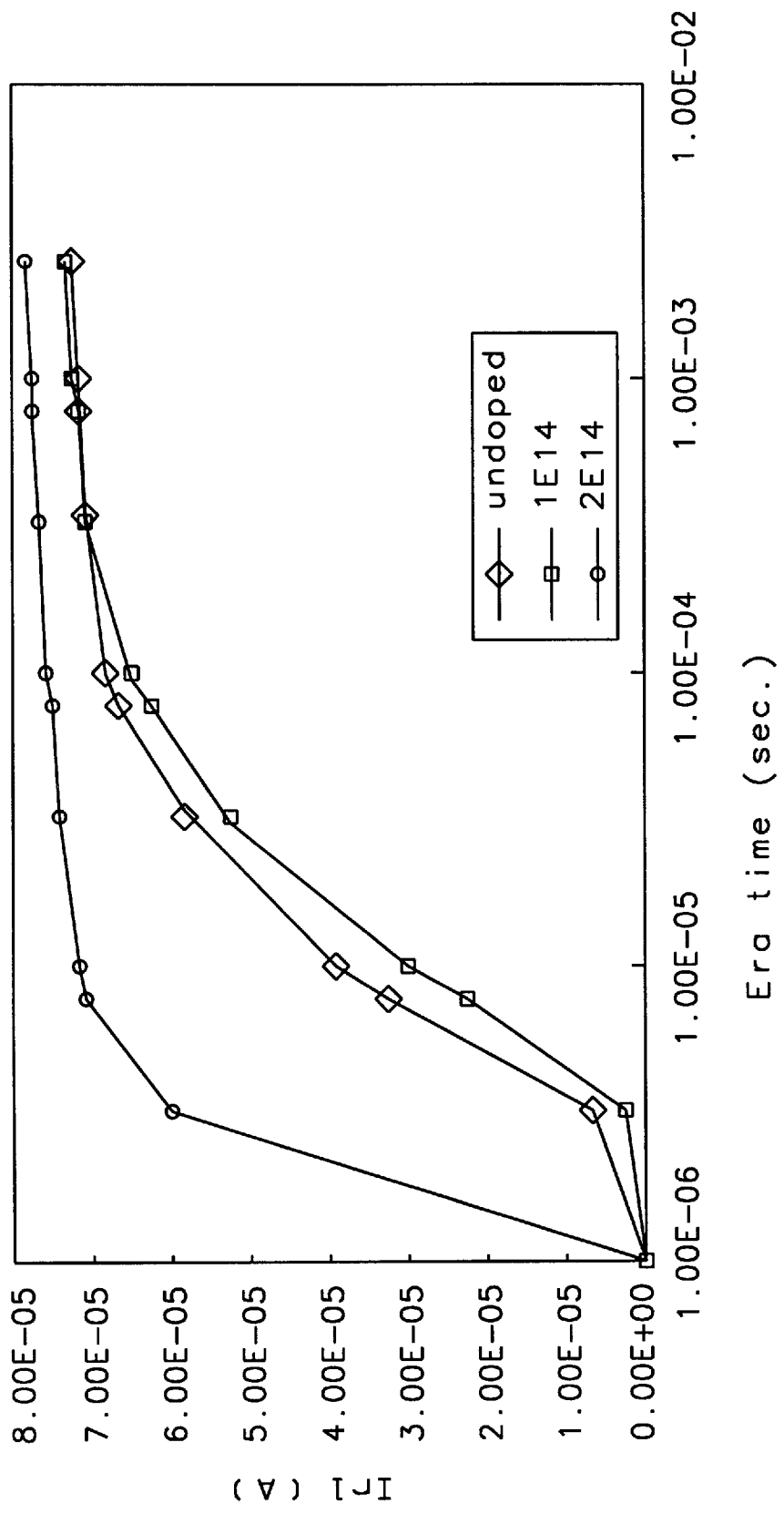
FIG. 5 is a graph of erasing speed for cells with a polysilicon 1 floating gate with a separate curve for each of the three different implant concentrations.

FIG. 5 is a graph of erasing speed for cells with a polysilicon 1 floating gate FG with a separate curve for each of the three different implant concentrations 0 E 14 atoms/cm$^3$, 1 E 14 atoms/cm$^3$, and 2 E 14 atoms/cm$^3$. On the left the erase current Ir1 (in the "1" state) ranges from 0.00 E+00 amperes to 8.00 E−05 amperes. The X axis has the values of Era_time (seconds) from 1.00 E−06 to 1.00 E−02. The differences in the curves on the upper right is due to the variation of Vt_fg. The currents are higher for the 2 E 14 atoms/cm$^3$ higher dose with littler deviation at the lower and zero dosages of the lower two curves.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a split gate EEPROM memory device on a doped silicon semiconductor substrate comprising:

forming an initial oxide layer upon the surface of said substrate, forming an undoped first polysilicon layer upon said initial oxide layer, forming a polysilicon oxide hard mask over said undoped first polysilicon layer, patterning said initial oxide layer and said undoped first polysilicon layer into a floating gate electrode stack, forming a tunnel oxide layer over said floating gate electrode stack and over said substrate aside from said floating gate electrode stack, forming a doped, second polysilicon layer over said tunnel oxide layer, patterning said tunnel oxide layer and said second polysilicon layer into a split control gate electrode stack above said substrate covering only one side of said floating gate electrode stack, and crossing over only one edge of said floating gate electrode stack to cover a portion of said floating gate stack, said split control gate electrode stack including a control gate electrode and said tunnel oxide layer, and forming, in the configuration of a split gate EEPROM memory device, a source region associated with said floating gate stack, and a drain region associated with said split control gate electrode stack.

2. A method in accordance with claim 1 wherein said initial oxide layer is composed of silicon dioxide (SiO$_2$) and has a thickness from about 50 Å to about 100 Å.

3. A method in accordance with claim 1 wherein:
said initial oxide layer is composed of silicon dioxide (SiO$_2$) and has a thickness from about 50 Å to about 100 Å, and
said undoped first polysilicon layer has a thickness from about 500 Å to about 1,500 Å.

4. A method in accordance with claim 1 wherein:
said initial oxide layer is composed of silicon dioxide (SiO$_2$) and has a thickness from about 50 Å to about 100 Å,
said undoped first polysilicon layer has a thickness from about 500 Å to about 1,500 Å, and
said tunnel oxide layer has a thickness from about 150 Å to about 300 Å.

5. A method in accordance with claim 1 wherein said floating gate electrode and said control gate electrode are in proximity along the sidewalls thereof.

6. A method in accordance with claim 1 wherein:
said initial oxide layer is composed of silicon dioxide (SiO$_2$) and has a thickness from about 50 Å to about 100 Å,
said undoped first polysilicon layer has a thickness from about 500 Å to about 1,500 Å,
said tunnel oxide layer has a thickness from about 150 Å to about 300 Å, and
said floating gate electrode and said control gate electrode are in proximity along the sidewalls thereof.

7. A method of forming a split gate EEPROM memory device on a doped silicon semiconductor substrate comprising:

forming an initial oxide layer upon the surface of said substrate, forming an undoped first polysilicon layer upon said substrate initial oxide layer, forming a polysilicon oxide hard mask over said undoped first polysilicon layer, patterning said initial oxide layer and said undoped first polysilicon layer into a floating gate electrode stack with a concave upper surface on said floating gate electrode, forming a tunnel oxide layer over said floating gate electrode stack and over said substrate aside from said floating gate electrode stack, forming a doped, second polysilicon layer over said tunnel oxide layer, patterning said tunnel oxide layer and said second polysilicon layer into a split control gate electrode stack above said substrate covering only one side of said floating gate electrode stack, and crossing over only one edge of said floating gate electrode stack, said split control gate electrode stack including a control gate electrode and said tunnel oxide layer, and forming, in the configuration of a split gate EEPROM memory devices a source region associated with said floating gate stack and a drain region associated with said split control gate electrode stack.

8. A method in accordance with claim 7 wherein said initial oxide layer is composed of silicon dioxide ($SiO_2$) and has a thickness from about 50 Å to about 100 Å.

9. A method in accordance with claim 8 wherein:

said initial oxide layer is composed of silicon dioxide ($SiO_2$) and has a thickness from about 50 Å to about 100 Å, said undoped first polysilicon layer has a thickness from about 500 Å to about 1,500 Å, and said tunnel oxide layer has a thickness from about 150 Å to about 300 Å.

10. A method in accordance with claim 8 wherein:

said initial oxide layer is composed of silicon dioxide ($SiO_2$) and has a thickness from about 50 Å to about 100 Å, said undoped first polysilicon layer has a thickness from about 500 Å to about 1,500 Å, said tunnel oxide layer has a thickness from about 150 Å to about 300 Å, and said floating gate electrode and said control gate electrode are in proximity along the sidewalls thereof.

* * * * *